United States Patent
Jankovich et al.

(10) Patent No.: US 11,029,828 B2
(45) Date of Patent: Jun. 8, 2021

(54) OBJECT CONNECTION BREAKING SYSTEM AND METHOD

(71) Applicant: Siemens Industry Software Inc., Plano, TX (US)

(72) Inventors: Steven Robert Jankovich, Buena Park, CA (US); Daren Rhoades, Laguna Hills, CA (US)

(73) Assignee: Siemens Industry Software Inc., Plano, TX (US)

( * ) Notice: Subject to any disclaimer, the term of this patent is extended or adjusted under 35 U.S.C. 154(b) by 949 days.

(21) Appl. No.: 14/707,532

(22) Filed: May 8, 2015

(65) Prior Publication Data

US 2016/0328126 A1    Nov. 10, 2016

(51) Int. Cl.
| | | |
|---|---|---|
| *G06F 3/0484* | (2013.01) | |
| *G06F 3/0482* | (2013.01) | |
| *G06F 3/0488* | (2013.01) | |
| *G06F 30/00* | (2020.01) | |

(52) U.S. Cl.
CPC ........ *G06F 3/04845* (2013.01); *G06F 3/0482* (2013.01); *G06F 3/04842* (2013.01); *G06F 3/04883* (2013.01); *G06F 30/00* (2020.01)

(58) Field of Classification Search
CPC .............................. G06F 3/04845; G06F 17/50
See application file for complete search history.

(56) References Cited

U.S. PATENT DOCUMENTS

| | | | | |
|---|---|---|---|---|
| 4,663,616 A | * | 5/1987 | Christensen | G06T 11/00 345/681 |
| 8,601,561 B1 | * | 12/2013 | Cleron | G06F 21/31 726/7 |
| 2011/0258537 A1 | * | 10/2011 | Rives | G06F 3/04883 715/255 |
| 2013/0335339 A1 | * | 12/2013 | Maunder | G06F 3/0488 345/173 |

* cited by examiner

*Primary Examiner* — Roland J Casillas

(57) ABSTRACT

A system having a processor is provided that visually manipulates objects on a touch screen responsive to inputs through the touch screen. The processor may receive a selection of a first object while a second object remains unselected. Also the processor may be responsive to first motion inputs representative of the selected first object being moved with a first motion that does not have a predetermined motion characteristic, to maintain a connection between the first and second objects while changing the positions of the first object and at least a first portion of the second object. In addition, the processor may be responsive to second motion inputs representative of the selected first object being moved with a second motion that has the predetermined motion characteristic, to break the connection between the first and second objects.

18 Claims, 5 Drawing Sheets

FIG. 5

OBJECT CONNECTION BREAKING SYSTEM AND METHOD

TECHNICAL FIELD

The present disclosure is directed, in general, to computer-aided design, visualization, and manufacturing systems, product data management (PDM) systems, product lifecycle management ("PLM") systems, and similar systems, that are used to create and manage data for products and other items (collectively referred to herein as product systems).

BACKGROUND

Computer-aided design (CAD) systems and other types of drawing systems may include a graphical user interface (GUI) through which drawings of products may be created. Such graphical user interfaces may benefit from improvements.

SUMMARY

Variously disclosed embodiments include systems and methods that may be used to draw objects in a CAD system or other type of drawing system. In one example, a system may comprise at least one processor configured to cause a display device to display a plurality of connected objects and to receive at least one selection input through an input device representative of a selection of a first one of the connected objects while a second one of the connected objects remains unselected. Also, the at least one processor may be configured to be responsive to first motion inputs received through the input device representative of the selected first object being moved with a first motion that does not have a predetermined motion characteristic, to maintain a connection between the first and second object while changing positions of the first object and at least a first portion of the second object displayed through the display device. In addition, the at least one processor may be configured to be responsive to second motion inputs received through the input device representative of the selected first object being moved with a second motion that has the predetermined motion characteristic, to break the connection between the first and second objects.

In another example, a method may include various acts carried out through operation of at least one processor. Such a method may include causing a display device to display a plurality of connected objects while receiving at least one selection input through an input device representative of selecting a first one of the connected objects while a second one of the connected objects remains unselected. In addition the method may include maintaining a connection between the first and second object while changing positions of the first object and at least a first portion of the second object displayed through the display device, responsive to receiving first motion inputs through the input device representative of the selected first object being moved with a first motion that does not have a predetermined motion characteristic. Further, the method may include through operation of the at least one processor, breaking the connection between the first and second objects, responsive to receiving second motion inputs through the input device representative of the selected first object being moved with a second motion that has the predetermined motion characteristic.

A further example may include non-transitory computer readable medium encoded with executable instructions (such as a software component on a storage device) that when executed, causes at least one processor to carry out this describe method.

The foregoing has outlined rather broadly the technical features of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiments disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the Detailed Description below, it may be advantageous to set forth definitions of certain words or phrases that may be used throughout this patent document. For example, the terms "include" and "comprise," as well as derivatives thereof, mean inclusion without limitation. The singular forms "a", "an" and "the" are intended to include the plural forms as well, unless the context clearly indicates otherwise. Further, the term "and/or" as used herein refers to and encompasses any and all possible combinations of one or more of the associated listed items. The term "or" is inclusive, meaning and/or, unless the context clearly indicates otherwise. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Also, although the terms "first", "second", "third" and so forth may be used herein to describe various elements, functions, or acts, these elements, functions, or acts should not be limited by these terms. Rather these numeral adjectives are used to distinguish different elements, functions or acts from each other. For example, a first element, function, or act could be termed a second element, function, or act, and, similarly, a second element, function, or act could be termed a first element, function, or act, without departing from the scope of the present disclosure.

In addition, phrases such as "processor is configured to" carry out one or more functions or processes, may mean the processor is operatively configured to or operably configured to carry out the functions or processes via software, firmware, and/or wired circuits. For example a processor that is configured to carry out a function/process may correspond to a processor that is actively executing the software/firmware which is programmed to cause the processor to carry out the function/process and/or may correspond to a processor that has the software/firmware in a memory or storage device that is available to be executed by the processor to carry out the function/process. It should also be noted that a processor that is "configured to" carry out one or more functions or processes, may correspond to a processor circuit particularly fabricated or "wired" to carry out the functions or processes (e.g., an ASIC or FPGA design).

The term "adjacent to" may mean: that an element is relatively near to but not in contact with a further element; or that the element is in contact with the further portion, unless the context clearly indicates otherwise.

Definitions for certain words and phrases are provided throughout this patent document, and those of ordinary skill in the art will understand that such definitions apply in many,

DETAILED DESCRIPTION

Various technologies that pertain to drawing systems will now be described with reference to the drawings, where like reference numerals represent like elements throughout. The drawings discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged apparatus. It is to be understood that functionality that is described as being carried out by certain system components may be performed by multiple components. Similarly, for instance, a component may be configured to perform functionality that is described as being carried out by multiple components. The numerous innovative teachings of the present application will be described with reference to exemplary non-limiting embodiments.

Many forms of drawing systems (such as CAD systems) are operative to manipulate various types of visual objects. Such visual objects may include geometric primitives such as line/curve segments, arcs, and splines. Such visual objects may also include 2-D and 3-D shapes such as circles, squares, rectangles, spheres, cones, cylinders, cubes, and cuboids. Such visual objects may also include combinations of simpler visual objects to form complex 2-D or 3-D structures. Thus in general, a drawing object may correspond to any type of graphical object that can be displayed through a display device (such as a display screen) that is capable of being visually manipulated via inputs through an input device with respect to shape, size, orientation, and/or position.

Figure 1:
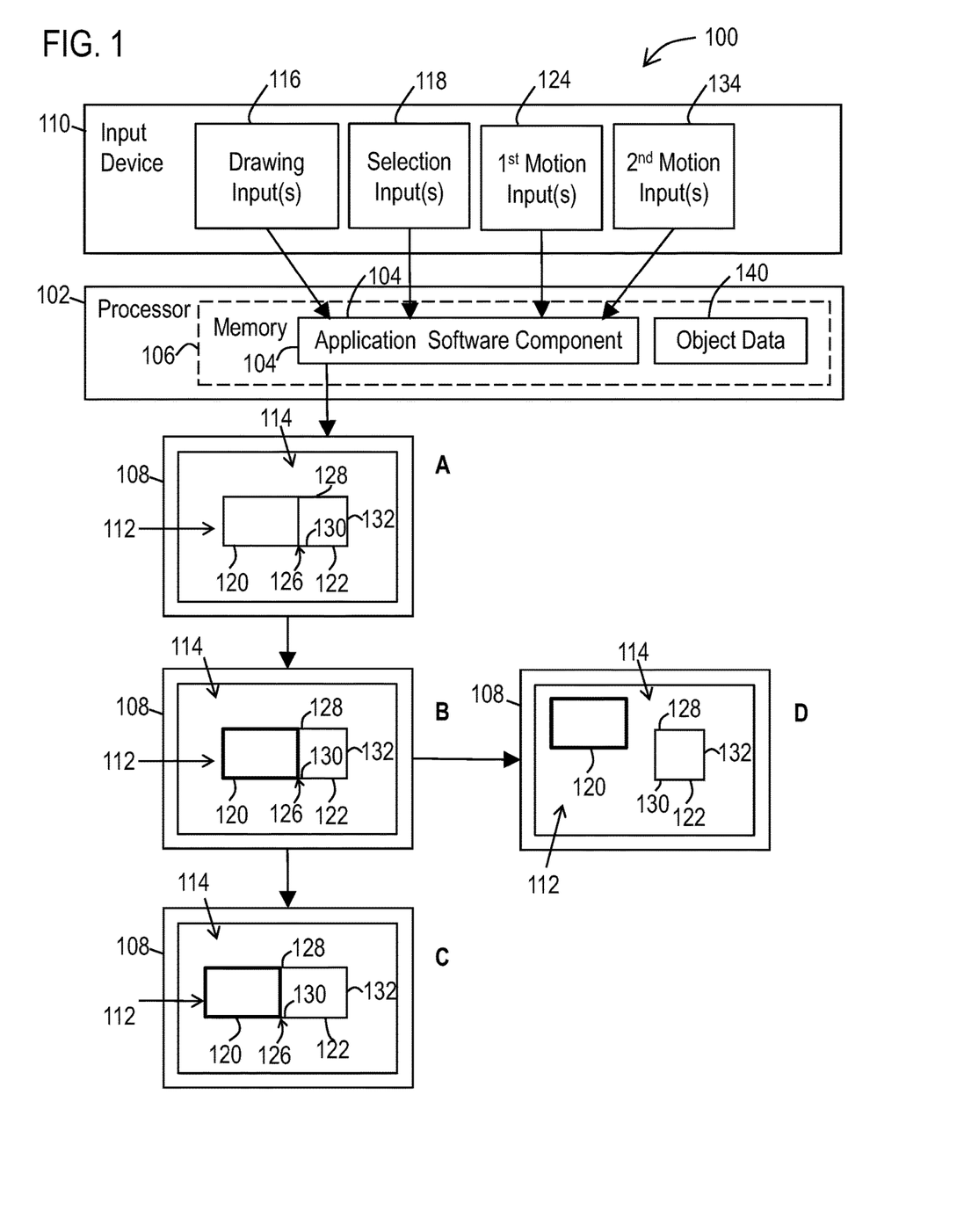
FIG. 1 illustrates a functional block diagram of an example system that facilitates manipulation of drawing objects.

With reference to FIG. 1, an example system 100 that facilitates drawing and manipulating objects is illustrated. The system 100 may include at least one processor 102 that is configured to execute one or more application software components 104 from a memory 106 in order to carry out the various features described herein. The application software component 104 may include a drawing software application or a portion thereof such as a CAD software application. Such a CAD software application may be operative to produce a CAD drawing based at least in part on inputs provided by a user.

An example of CAD/CAM/CAE software that may be adapted to include at least some of the functionality described herein includes the NX suite of applications that is available from Siemens Product Lifecycle Management Software Inc. (Plano, Tex.). However, it should also be understood that such a drawing software application may correspond to other types of drawing software, including vector based illustration software, presentation software, diagramming software, word processing applications, games, visual programming tools, and/or any other type of software that involves drawing and manipulation of objects. Also, the examples described herein may be usable with respect to graphical user interfaces in which one graphical user object has a connection or other type of relationship with another graphical user interface object (or group of objects).

The described system may include at least one display device 108 (such as a display screen) and at least one input device 110. For example, the processor 102 may be integrated into a housing that includes a touch screen that serves as both an input and display device. Examples of such systems may include mobile phones, tablets, and notebook computers. However, it should be appreciated that example embodiments may use other types of input and display devices. For example, systems may include display devices with display screens that do not include touch screens, such as an LCD monitor or a projector. Further, systems may use other types of input devices to provide inputs for manipulating objects such as a mouse, pointer, touch pad, drawing tablet, track ball, joystick, keypad, keyboard, camera, motion sensing device, or any other type of input device capable of providing the inputs described herein.

Further it should be noted that the processor described herein may be located in a server that is remote from the display and input devices described herein. In such an example, the described display device and input device may be included in a client device that communicates with the server (and/or a virtual machine executing on the server) through a wired or wireless network (which may include the Internet). In some embodiments, such a client device for example may execute a remote desktop application or may correspond to a portal device that carries out a remote desktop protocol with the server in order to send inputs from an input device to the server and receive visual information from the server to display through a display device. Examples of such remote desktop protocols include Teradici's PCoIP, Microsoft's RDP, and the RFB protocol. In such examples, the processor described herein may correspond to a virtual processor of a virtual machine executing in a processor of the server.

FIG. 1 schematically illustrates a plurality of different views (A-D) of the display device 108 that are caused to be displayed by the processor 102 in response to various inputs received through the input device 110. For example in view A of the display device 108, the processor 102 may be configured to cause the display device 108 to draw a plurality of connected objects 112 on a workspace 114 responsive to drawing inputs 116 received through the input device 110. Such a workspace 114 may correspond to a two-dimensional background surface on which objects are drawn, displayed, and manipulated in a graphical user interface of the application software component 104. However, it should also be appreciated that for 3-D drawings, the workspace may correspond to a two dimensional view of a three dimensional space in which objects are visually drawn, displayed, and manipulated using the graphical user interface of the application software component 104. Also in other examples, 3-D displays may be used to render 3-D drawings in a 3-D workspace.

With respect to FIG. 1, the depicted connected objects 112 may include a first object 120 and a second object 122. Each of these objects may correspond to a curve network of one or more line/curve segments that are connected to each other. Such line/curve segments may be straight and/or curved and a connected group of them may be referred to as a curve set. Each of the objects 120 and 122 may be individually selected for manipulation. For example, such a curve network may permit the first object 120 to be selected, moved, rotated, and scaled. During such manipulations of the selected first object, some of the lines comprising the unselected second object 122 may be updated by the application software component to ensure that the connections and relationships between the selected and unselected objects 120, 122 (i.e., curve sets) are maintained.

To enable these features, the processor 102 may be configured to receive at least one selection input 118 through the input device 110 representative of a selection of the first one 120 of the connected objects 112, while the second one 122 of the connected objects 112 remains unselected. As shown in view B of the display device, in response to such a selection input, the processor may cause the first object 120 to be highlighted (via a distinctive bold or colored border or other visual cue), while the second object 122 is not visually highlighted.

As shown in view C of the display device, the processor may be configured to be responsive to first motion inputs 124 received through the input device 110 representative of the selected first object 120 being moved with a first motion that does not have a predetermined motion characteristic, to maintain a connection 126 between the first and second objects 120, 122 while changing the position of the first object 120 and at least a first portion of the second object 122.

In this example, the first portion of the second object that moves with the first motion includes the ends 128, 130 of the top and bottom walls of the second object 122. These walls stretch to maintain their connection with the first object while a second portion 132 (right side end) of the second object 122 remains stationary on the workspace 114. However, as will be discussed in more detail below with respect to FIG. 3, in some embodiments the first portions 128, 130 of the second object may not have the capability to stretch in this manner. As a result, the entire unselected second object 122 may move with the movement of the selected first object.

In example embodiments, it may be desirable to separate and disconnect such connected objects 112 without needing to select the connection 126. To carry this out, an example embodiment of the application software component 104 may be operative to distinguish between different types of motions (i.e., gestures) in order to determine whether to break or maintain the connection between the first and second objects 120, 122 based on a determination as to whether the motions of the selected object include the predetermined characteristic. Thus as shown in view D of the display device, the processor may be configured to be responsive to second motion inputs 134 received through the input device 110 representative of the selected first object 120 being moved with a second motion that does have the predetermined motion characteristic, to break the connection between the first and second objects 120, 122 and to cause the first and second objects to be displayed in spaced apart relation through the display device 108.

Examples of predetermined motion characteristics that may be determined from motion inputs may correspond to a speed, an acceleration, a number of direction changes, an amount of time, a movement distance, or any combination thereof having at least one predetermined relationship with at least one predetermined threshold.

For example, the at least one predetermined threshold may represent a predetermined speed. Thus, the corresponding predetermined motion characteristic that is determined may include a motion speed that reaches (i.e., is equal to or greater than) the predetermined speed.

In addition, for example, the at least one predetermined threshold may represent a predetermined acceleration. Thus, the corresponding predetermined motion characteristic that is determined may include a motion acceleration that reaches (i.e., is equal to or greater than) the predetermined acceleration.

Also for example, the at least one predetermined threshold may represent a predetermined number of direction changes in a predetermined amount of time. Thus, the corresponding predetermined motion characteristic that is determined may include a motion with a number of direction changes that reaches (i.e., is equal to or greater than) the predetermined number of direction changes within (i.e., is equal to or less than) the predetermined amount of time.

Further, for example, the at least one predetermined threshold may represent a predetermined amount of time. Thus, the corresponding predetermined motion characteristic that is determined may include a continuous motion over a period of time that reaches (i.e., is equal to or greater than) the predetermined amount of time.

In another example, the at least one predetermined threshold may represent a predetermined distance. Thus, the corresponding predetermined motion characteristic that is determined may include a continuous motion in which a distance of the motion in at least one direction on the workspace reaches (i.e., is equal to or greater than) the predetermined distance.

It should be understood that as used herein and in the claims, the wording "reaches" may correspond to either: equal to and/or greater than the predetermined threshold; or equal to or less than the predetermined threshold, depending on whether the predetermined threshold corresponds to higher valve measurement that must be achieved starting from a relatively lower value measurement in order to trigger some action, or corresponds to a lower value measurement that must achieved starting from a higher value measurement in order to trigger some action.

In an example embodiment, the application software component may require the detection of one or more of these predetermined motion characteristics before breaking the first object from the second object. For example, a user may produce a combination of some of these described predetermine motion characteristics by selecting the first portion of the object and quickly shaking it back and forth.

Figure 2:
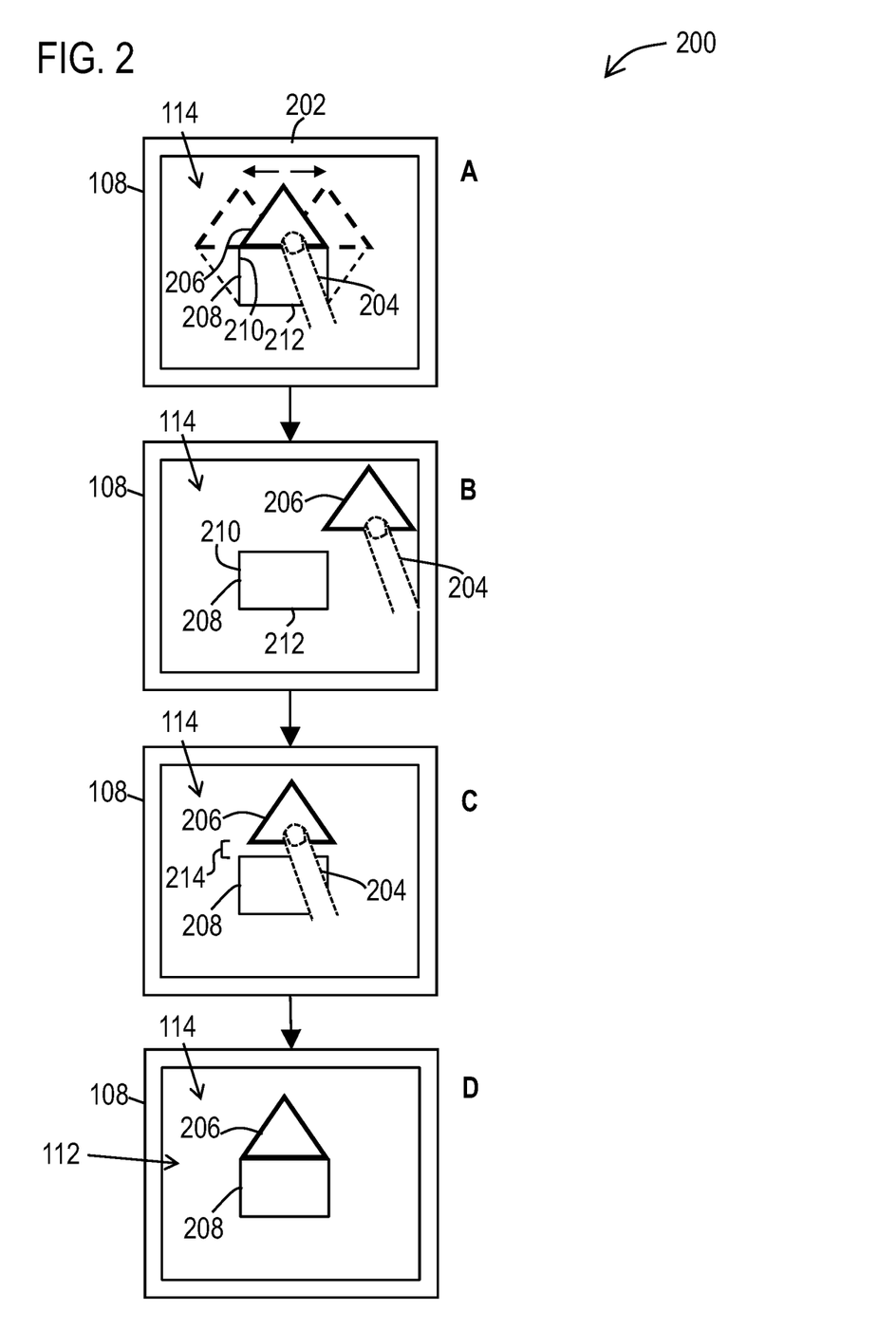
FIG. 2 illustrates examples views of a workspace in which objects are broken apart using a shaking motion and are reconnect by moving them close together.

An example of this process is illustrated in FIG. 2, in which a front view 200 of a touch screen 202 is depicted showing a plurality of different views (A-D) that are caused to be displayed on the display screen 108 of touch screen by the processor 102 in a housing associated with the touch screen, in response to various inputs received through the input device 110 of the touch screen.

As shown in workspace view A, a user may take their finger 204 (or a stylus), press down on a displayed first object 206 of two connected objects 206, 208 and while continuously touching the touch screen 202, move their finger (or stylus) quickly back and forth in a shaking motion that triggers the breaking of the first object from the second object. In an example, the application software component 104 may be operative to detect such a shaking motion by detecting a number of back and forth motions that is above a predetermined number of direction changes within a predetermined amount of time (e.g., change direction 3 times in 0.5 seconds).

In this example, as the user moves their finger (or stylus), the application software component may be operative to show movement of the first object 206 based on the position of the finger relative to the touch screen while maintaining the connection between the first object 206 and the second object 208. For example, in FIG. 2, the broken line versions of the first object 206 correspond to movement of the first object to the left and right of its original position in bold lines.

As shown in FIG. 2, the second object 208 may include a first portion 210 that is directly connected to the first object 206, and may include a second portion 212 that is indirectly connected to the first object 206 via the first portion 210 of the second object. In order to maintain the connection between the first and second objects during the movement of the first object (and prior to the connection being broken), the application software component may automatically change the first portion 210 of the second object (by causing it to move, pivot and/or change in size), while a second portion 212 of the second object remains stationary. As a result, the overall shape and/or size of the second object may automatically change based on changes in position of the first object being manipulated. It should also be noted that the application software component may automatically change the first portion 210 of the second object responsive to other manipulations of the selected first object, such as by changing a rotational orientation and/or a size of the first object.

As illustrated in workspace view B, when the application software component detects the desired combination of predetermined motion characteristics (speed/acceleration and direction changes), the application software component may separate the first object 206 from the second object 208 and display the first object such that it moves with the motion of the finger (or stylus) without causing the first portion of the second object to move. The application software component may also automatically return the shape of the second object 208 back to its original shape prior to its first object being moved (and/or being rotated and/or having its size changed).

It should also be appreciated that corresponding motions with the predetermined motion characteristics may be achieved with other types of input devices. For example, the application software component may be responsive to mouse inputs clicking and holding a mouse button down with a pointer on the first object 206 and a back and forth shaking motion of the mouse, to cause the first and second objects to break apart as described previously with respect to a finger on a touch screen. Further, in other examples, a touchpad, gamepad, joystick, trackball, camera, motion sensing device, or other type of input device may be used to provide inputs that are operative to select and move an object with the described predetermined motion characteristics.

In order to be able to cause the second object to return back to its original shape after the first object is broken away from the second object, the processor may be configured to store in the memory 106, object data 140 (see FIG. 1) representative of the shapes and relative positions of the first and second objects when the first and second objects were connected (prior to manipulation of the first object). Thus, responsive to the detection of the predetermined motion characteristics, the application software component may use this data to revert the second object back to its original shape.

In addition, the application software component may be operative to use this object data to visually reconnect the first object to the second object responsive to third motion inputs through the input device representative of the selected first object being moved to a further position relative to the second object that is within a predetermined distance of corresponding to the relative position stored in the memory for when the first and second objects were connected.

For example as illustrated in workspace view C, the application software component may be operative to monitor movement of the first object 206 via the finger 204 (or stylus) dragging the first portion around the workspace 114 to determine if the first object 206 moves within a predetermined distance 214 of the second portion 208. The application software component may be operative to determine from the object data that the selected object 206 was previously connected to the second object 208 and responsive to this information monitor the motion of the first object to determine if it moves to a position that reaches the predetermined distance (i.e., is equal to or less than the predetermined distance).

As illustrated in workspace view D of FIG. 2, when this position is detected, based on the object data in the memory, the application software component may be operative to cause the first object 206 to be reconnected with the second object 208 in the same positions (and/or shapes) they were in prior to the motion that caused them to be broken apart and/or prior to the first object being manipulated. Thus the connected objects 206, 208 may be displayed with the same shape and construction as it had in view A of FIG. 2. However, in further embodiments the connection between the first and second objects may be reformed, but with the shape of the second object being changed to connect to the first object in the current position of the first object.

In the previous described examples, the various objects have been described as including portions that make up the object. However, it should be understood that in an example embodiment, such portions may correspond to a plurality of primitive type objects (e.g., lines, circles, arcs, ellipses, splines) that are connected together to form the more complex shape. Thus in the examples above (such as the selected rectangle shaped object 120 in FIG. 1), the selected objects, may correspond to a selection of a plurality of primitive type objects (e.g., lines) that are connected together to form the more complex shape (e.g., a rectangle).

As discussed previously with respect to FIGS. 1 and 2, as the first object is moved, portions of the second object move (i.e., change in size, pivot) to maintain the connection with the first object. Such a connection between the two objects creates a constraint between the objects (enforced by the application software component), such as movement of a first one of two connected objects causes movement of at least a portion of the connected second object.

In an example embodiment, the described first portions of the second object (e.g., portions 128, 130, of the second object 122 in FIG. 1), that stretch or pivot as the first object moves, may correspond to individual primitive type objects (e.g., lines) that have the capability to change in this manner based on their connection to the selected primitive type objects that make up the described first object.

However, in alternative embodiments, the entire unselected second object may remain stationary, and portions (e.g., primitive type objects) of the selected first object may be caused by the application software component 104 to change (i.e., in size, pivot) to maintain the connection with the second object.

Figure 3:
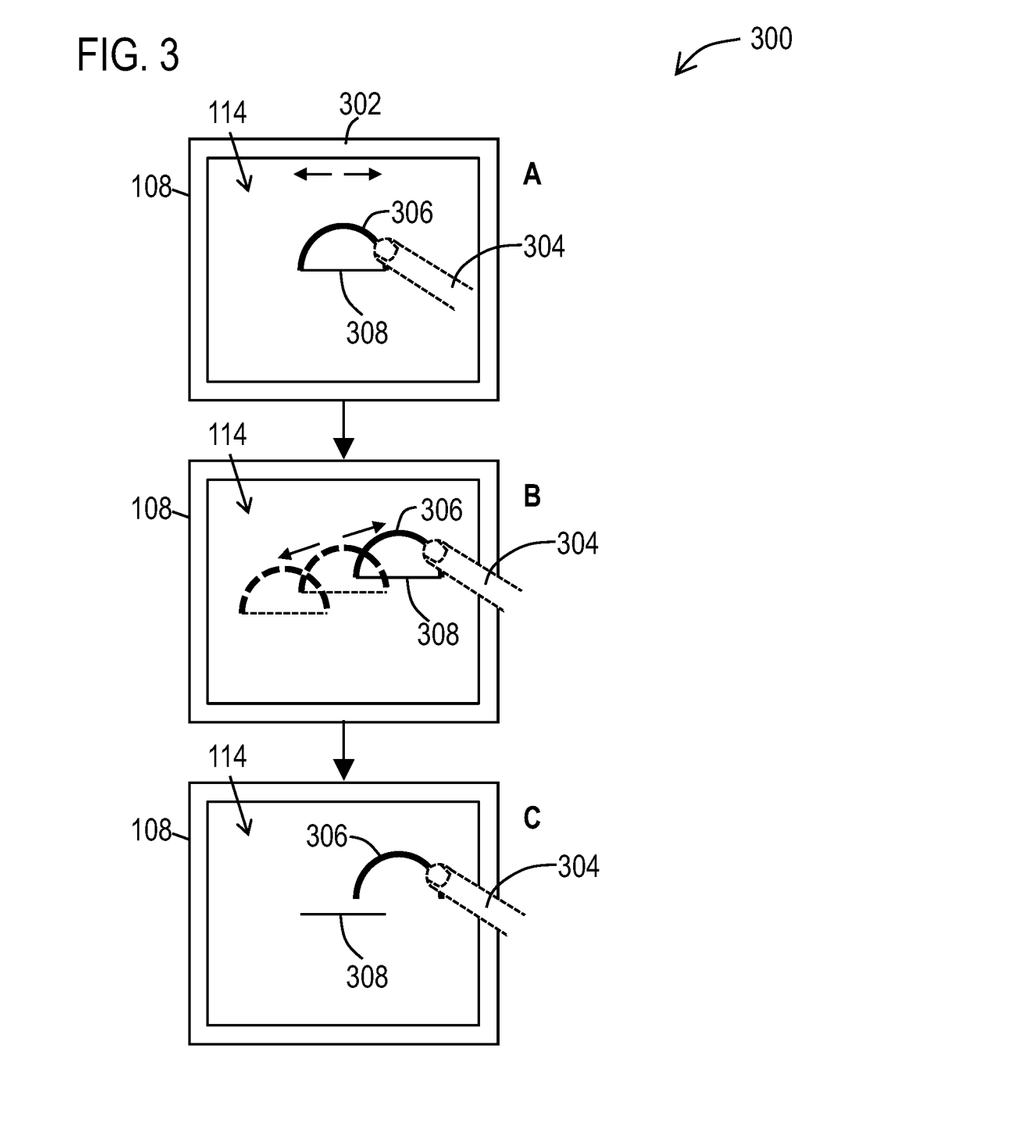
FIG. 3 illustrates examples views of a workspace in which objects are broken apart using a shaking motion in which the connected objects move together.

Also, as discussed previously, in some embodiments, neither the first or second objects may change shape while being moved. For example, FIG. 3 illustrates a front view 300 of a touch screen 302 showing a plurality of different views (A-C) that are caused to be displayed on the display screen 108 of touch screen by the processor 102 in a housing associated with the touch screen, in response to various inputs received through the input device 110 of the touch screen.

As shown in workspace view A, a user may take their finger 304 (or a stylus), press down on a displayed first object 306 (e.g., an arc primitive type object) of two connected objects 306, 308 in order to select it and begin to move it. As shown in view B, as the first selected object 306 is moved (in a back and forth dragging motion) the entire second object 308 (e.g., a line primitive type object) also moves. Thus in this example, both the first and second objects remain connected and maintain their shapes and sizes as the selected first object is dragged back and form on the display screen 108.

As illustrated in workspace view C, when the application software component detects the desired combination of predetermined motion characteristics (such as a shaking motion or other speed/acceleration and direction changes), the application software component may separate the first object 306 from the second object 308 and display the first object such that it moves with the motion of the finger 304 (or stylus) without causing the second object 308 to move. The application software component may also automatically return the location of the second object 308 back to its original position from before the first and second objects were moved (e.g., via the shaking motion).

In an example embodiment, the user interface of the application software component may include (in addition to the workspace) a configuration menu, window or other graphical user interface control that enables a user to set and modify the predetermined data (speed, acceleration, time, distances) on which determinations are made to break apart objects and/or reconnect objects.

In addition, in the previously described embodiments connections between objects are depicted as the objects visibly touching each other. However, it should be appreciated that in some examples, objects may be connected together (i.e., with a constraint such as a constraint on motion) in which the objects are spaced apart. For example, two concentric circle type primitive objects (with different diameters) may be connected together such that movement of one moves the other so that their centers remain coincident. Also, it should be appreciated that the described predetermined motion that is detect to break the connection between such originally spaced apart connected objects may result in the objects being spaced closer together and/or overlapping after the connection is broken.

In addition, it should be appreciated that the example process for shaking a selected first object/element in order to break it away from an unselected second object/element, may be adapted to work with other types of 2D or 3D drawing and engineering applications. Such other examples may include: breaking connections between objects in a diagramming tool; deleting joints between 3D components in a mechanism depicted in 3D drawing; deleting mating conditions from a 3D component in an assembly depicted in a 3D drawing; and deleting constraints and load from a finite element model.

In addition, it should be appreciated that the example processes for breaking a connection between selected first object(s) and unselected second object(s), may be adapted to work with other aspects of graphical user interfaces: such as freeing a tool bar from a constrained transformation (e.g., the "dialog rail" in the NX suite of applications).

Further, it should be noted that the example processes for breaking connections may be used to free a selected set of objects from membership in an existing group, or any other process in which it is desirable to break a relationship (e.g., a connection or association) via an input gesture, without needing to first select (e.g., tap, click) a graphical or textual representation of the relationship itself.

In addition, it should be understood, that the term "connection" as used herein refers to objects that are constrained in some functional manner. Thus two objects that are merely adjacent to each other, (absent some functional relationship) are not connected together. For example, a line end placed adjacent another line end on a workspace may visually appear to be connected. However, absent at least one constraint associated with the visually adjacent line ends, such an example does not correspond to a connection between the two line ends. Rather, a connection of the two line ends may correspond to a constraint that manifests itself in the motion of one line affecting the position/shape/orientation of the other line.

Thus, the motion of a first one of the connected lines causes motion of at least a portion of a second one of the connected lines (e.g., as in the Examples in FIGS. 1 and 2, portions of the second object change size and/or pivot, as the first object is moved). Also, as discussed previously with respect to FIG. 3, a constraint between two connected lines may correspond to the motion of one of the selected lines causing both connected lines to move together.

Also, it should be appreciated that other types of connections may have other types of constraints. For example, as discussed previously, a connection may correspond to an object being a member of a group. The constraint for this type of connection may correspond to a functional association (controlled via a software component), in which properties of the object are inherited by properties of the group. The breaking of the connection (via the motions described herein) may break the constraint/relationship, such that the object is no longer a member of the group and no longer inherits properties from the group.

Figure 4:
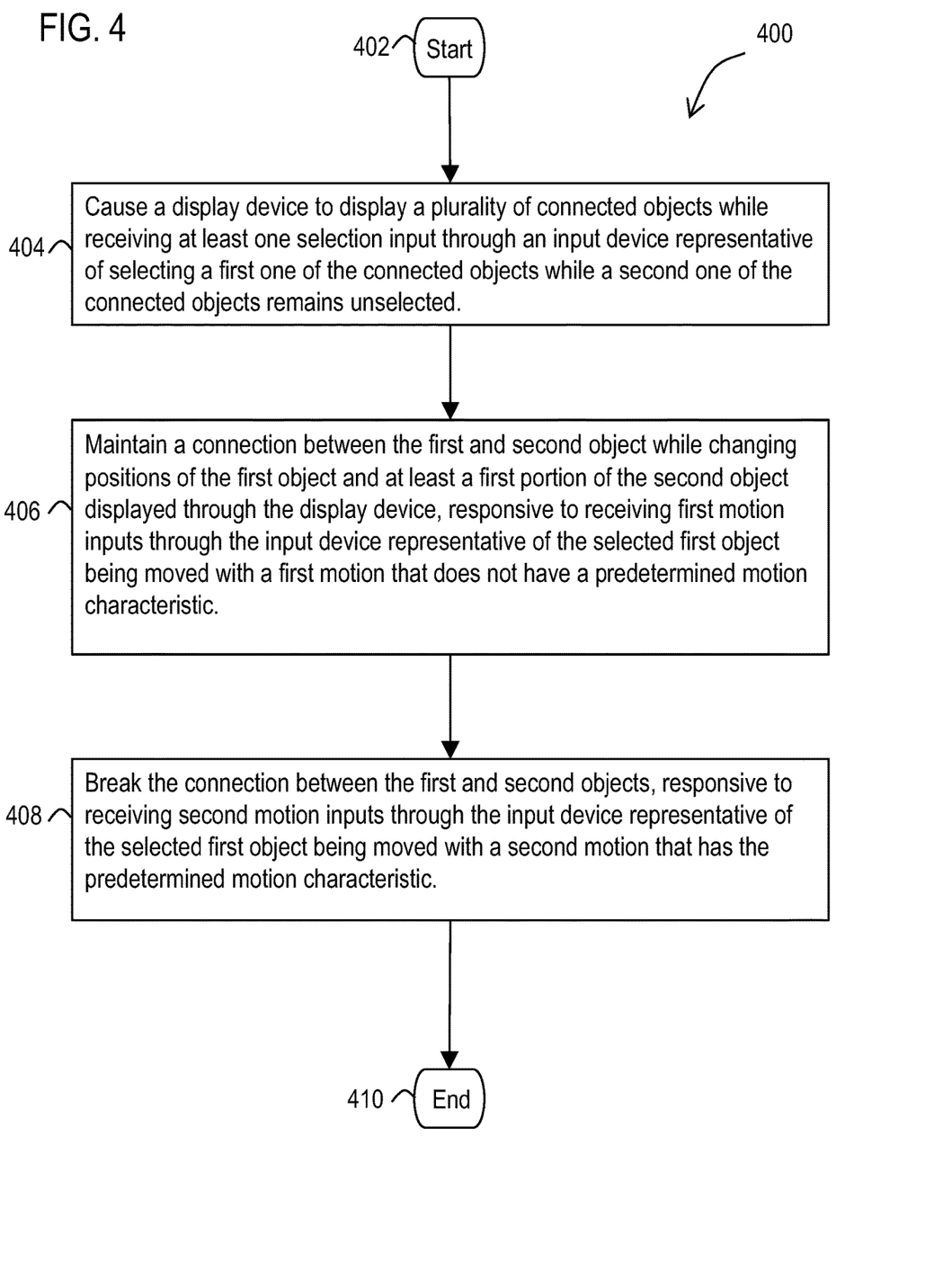
FIG. 4 illustrates a flow diagram of an example methodology that facilitates manipulation of drawing objects.

With reference now to FIG. 4, various example methodologies are illustrated and described. While the methodologies are described as being a series of acts that are performed in a sequence, it is to be understood that the methodologies may not be limited by the order of the sequence. For instance, some acts may occur in a different order than what is described herein. In addition, an act may occur concurrently with another act. Furthermore, in some instances, not all acts may be required to implement a methodology described herein.

It is important to note that while the disclosure includes a description in the context of a fully functional system and/or a series of acts, those skilled in the art will appreciate that at least portions of the mechanism of the present disclosure and/or described acts are capable of being distributed in the form of computer-executable instructions contained within non-transitory machine-usable, computer-usable, or computer-readable medium in any of a variety of forms, and that the present disclosure applies equally regardless of the particular type of instruction or signal bearing medium or storage medium utilized to actually carry out the distribution. Examples of non-transitory machine usable/readable or computer usable/readable mediums include: ROMs, EPROMs, magnetic tape, floppy disks, hard disk drives, SSDs, flash memory, CDs, DVDs, and Blu-ray disks. The computer-executable instructions may include a routine, a sub-routine, programs, applications, modules, libraries, a thread of execution, and/or the like. Still further, results of acts of the methodologies may be stored in a computer-readable medium, displayed on a display device, and/or the like.

Referring now to FIG. 4, a methodology 400 that facilitates precise manipulation of drawing objects is illustrated. The method may start at 402 and at 404 the methodology may include the act of through operation of at least one processor, causing a display device to display a plurality of connected objects while receiving at least one selection input through an input device representative of selecting a first one of the connected objects while a second one of the connected objects remains unselected. Also the methodology 400 may include the act 406 of through operation of the at least one processor, maintaining a connection between the first and second object while changing positions of the first object and at least a first portion of the second object displayed through the display device, responsive to receiving first motion inputs through the input device representative of the selected first object being moved with a first motion that does not have a predetermined motion characteristic. In addition, the methodology 400 may include the act 408 of through operation of the at least one processor, breaking the connection between the first and second objects (which is some examples may cause the first and second objects to be displayed in spaced apart relation through the display device), responsive to receiving second motion inputs through the input device representative of the selected first object being moved with a second motion that has the predetermined motion characteristic. At 410 the methodology may end.

In addition, the methodology 400 may include other acts and features discussed previously with respect to the system 100. For example, maintaining the connection between the first and second objects may be carried out responsive to determining that the first motion inputs do not have the first characteristic. Also, breaking the connection between the first and second portions may be carried out responsive to determining that the second motion inputs are associated with movement of the selected first object and the first portion of the second object without moving a second portion of the second object and that the second motion has the predetermined motion characteristic.

As discussed previously such a predetermined motion characteristic may correspond to a continuous back and forth and motion that reaches a predetermined number of direction changes within in a predetermined amount of time. However, in other example embodiments of the methodology, other characteristics of motion may be used to determine when to break the connection between the first and second objects.

In addition, as discussed previously the first portion of the second object may be directly connected to the first object, while the second portion of the second object is indirectly connected to the first object through the first portion of the second object. With such a connection, the methodology 400 may include responsive to the first motion inputs changing the first portion of the second object to maintain the connection between the first and second objects, while the second portion of the first object remains stationary. In addition, the methodology may include storing object data in a memory representative of an initial configuration of the second object before the first portion of the second object was changed via the first motion inputs. Further the method may include responsive to the second motion inputs, through operation of the at least one processor, changing a current configuration of the second object to correspond to its initial configuration.

The example methodology may also include, storing object data in a memory representative of positions of the first and second objects when the first and second objects were connected. Further, the methodology may include using the object data to reconnect the first object to the second object responsive to third motion inputs through the input device representative of the selected first object being moved to a further position relative to the second object that is within a predetermined distance of corresponding to the position stored in the memory for when the first and second objects were connected.

As discussed previously, such acts associated with these methodologies may be carried out by one or more processors. Such processor(s) may be included in one or more data processing systems for example that execute software components operative to cause these acts to be carried out by the one or more processors. In an example embodiment, such software components may be written in software environments/languages/frameworks such as Java, JavaScript, Python, C, C #, C++ or any other software tool capable of producing components and graphical user interfaces configured to carry out the acts and features described herein.

Figure 5:
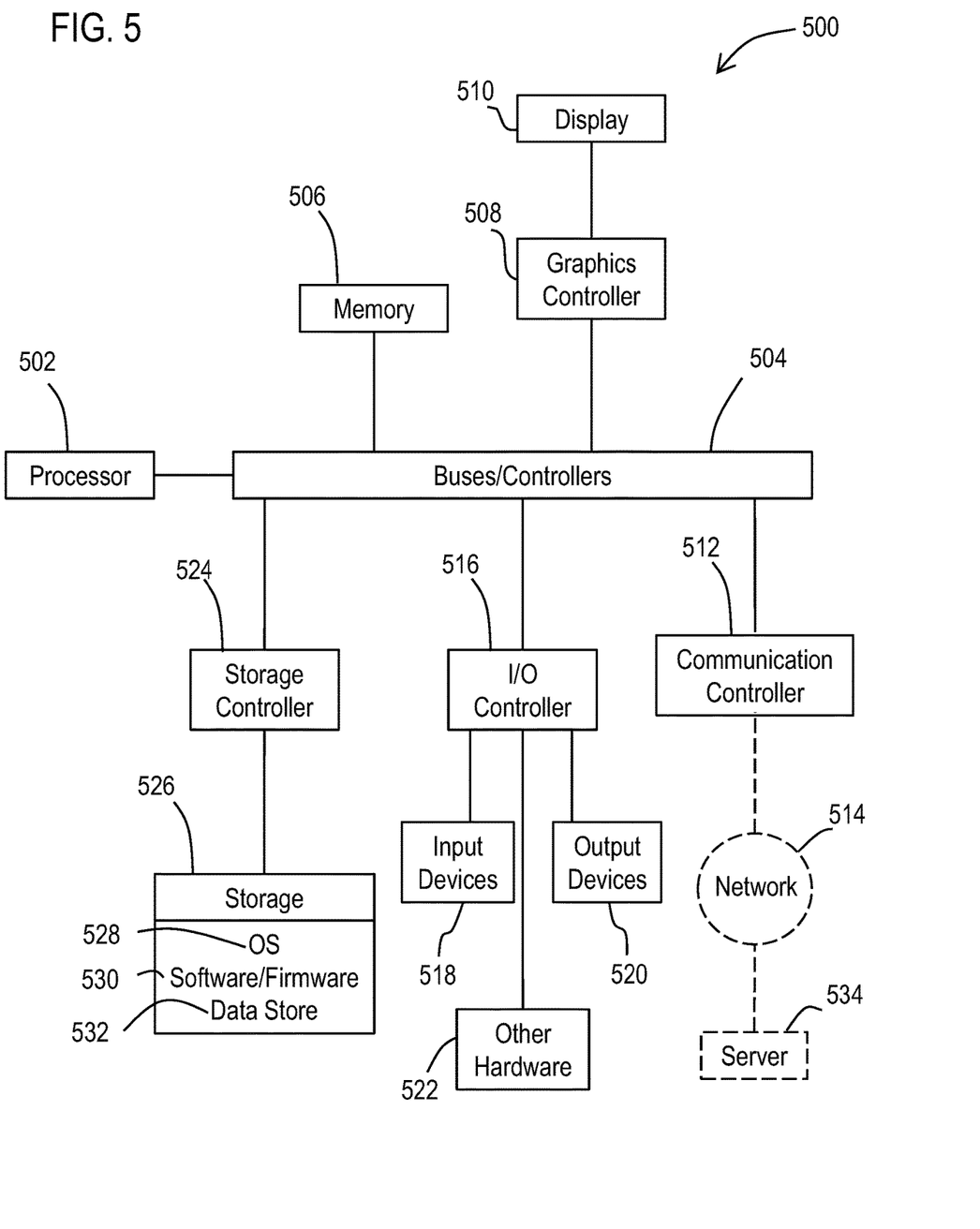
FIG. 5 illustrates a block diagram of a data processing system in which an embodiment can be implemented.

FIG. 5 illustrates a block diagram of a data processing system 500 (also referred to as a computer system) in which an embodiment can be implemented, for example as a portion of a PLM, CAD, and/or drawing system operatively configured by software or otherwise to perform the processes as described herein. The data processing system depicted includes at least one processor 502 (e.g., a CPU) that may be connected to one or more bridges/controllers/buses 504 (e.g., a north bridge, a south bridge). One of the buses 504 for example may include one or more I/O buses such as a PCI Express bus. Also connected to various buses in the depicted example may include a main memory 506 (RAM) and a graphics controller 508. The graphics controller 508 may be connected to one or more display devices 510. It should also be noted that in some embodiments one or more controllers (e.g., graphics, south bridge) may be integrated with the CPU (on the same chip or die). Examples of CPU architectures include IA-32, x86-64, and ARM processor architectures.

Other peripherals connected to one or more buses may include communication controllers 512 (Ethernet controllers, WiFi controllers, cellular controllers) operative to connect to a local area network (LAN), Wide Area Network (WAN), a cellular network, and/or other wired or wireless networks 514 or communication equipment.

Further components connected to various busses may include one or more I/O controllers 516 such as USB controllers, Bluetooth controllers, and/or dedicated audio controllers (connected to speakers and/or microphones). It should also be appreciated that various peripherals may be connected to the USB controller (via various USB ports) including input devices 518 (e.g., keyboard, mouse, touch screen, trackball, camera, microphone, scanners), output devices 520 (e.g., printers, speakers) or any other type of device that is operative to provide inputs or receive outputs from the data processing system. Further it should be appreciated that many devices referred to as input devices or output devices may both provide inputs and receive outputs of communications with the data processing system. Further it should be appreciated that other peripheral hardware 522 connected to the I/O controllers 516 may include any type of device, machine, or component that is configured to communicate with a data processing system.

Additional components connected to various busses may include one or more storage controllers 524 (e.g., SATA). A storage controller may be connected to a storage device 526 such as one or more storage drives and/or any associated removable media, which can be any suitable non-transitory machine usable or machine readable storage medium. Examples, include nonvolatile devices, volatile devices, read only devices, writable devices, ROMs, EPROMs, magnetic tape storage, floppy disk drives, hard disk drives, solid-state drives (SSDs), flash memory, optical disk drives (CDs, DVDs, Blu-ray), and other known optical, electrical, or magnetic storage devices drives and/or computer media. Also in some examples, a storage device such as an SSD may be connected directly to an I/O bus 504 such as a PCI Express bus.

A data processing system in accordance with an embodiment of the present disclosure may include an operating system 528, software/firmware 530, and data stores 532 (that may be stored on a storage device 526). Such an operation system may employ a command line interface (CLI) shell and/or a graphical user interface (GUI) shell. The GUI shell permits multiple display windows to be presented in the graphical user interface simultaneously, with each display window providing an interface to a different application or to a different instance of the same application. A cursor or pointer in the graphical user interface may be manipulated by a user through a pointing device such as a mouse or touch screen. The position of the cursor/pointer may be changed and/or an event, such as clicking a mouse button or touching a touch screen, may be generated to actuate a desired response. Examples of operating systems that may be used in a data processing system may include Microsoft Windows, Linux, UNIX, iOS, and Android operating systems.

The communication controllers 512 may be connected to the network 514 (not a part of data processing system 500), which can be any public or private data processing system network or combination of networks, as known to those of skill in the art, including the Internet. Data processing system 500 can communicate over the network 514 with one or more other data processing systems such as a server 534 (also not part of the data processing system 500). However, an alternative data processing system may correspond to a plurality of data processing systems implemented as part of a distributed system in which processors associated with several data processing systems may be in communication by way of one or more network connections and may collectively perform tasks described as being performed by a single data processing system. Thus, it is to be understood that when referring to a data processing system, such a system may be implemented across several data processing systems organized in a distributed system in communication with each other via a network.

Further, the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely.

In addition, it should be appreciated that data processing systems may be implemented as virtual machines in a virtual machine architecture or cloud environment. For example, the processor 502 and associated components may correspond to a virtual machine executing in a virtual machine environment of one or more servers. Examples of virtual machine architectures include VMware ESCi, Microsoft Hyper-V, Xen, and KVM.

Those of ordinary skill in the art will appreciate that the hardware depicted for the data processing system may vary for particular implementations. For example the data processing system 500 in this example may correspond to a computer, workstation, and/or a server. However, it should be appreciated that alternative embodiments of a data processing system may be configured with corresponding or alternative components such as in the form of a mobile phone, tablet, controller board or any other system that is operative to process data and carry out functionality and features described herein associated with the operation of a data processing system, computer, processor, and/or a controller discussed herein. The depicted example is provided for the purpose of explanation only and is not meant to imply architectural limitations with respect to the present disclosure.

As used herein, the terms "component" and "system" are intended to encompass hardware, software, or a combination of hardware and software. Thus, for example, a system or component may be a process, a process executing on a processor, or a processor. Additionally, a component or system may be localized on a single device or distributed across several devices.

Also, as used herein a processor corresponds to any electronic device that is configured via hardware circuits, software, and/or firmware to process data. For example, processors described herein may correspond to one or more (or a combination) of a microprocessor, CPU, FPGA, ASIC, or any other integrated circuit (IC) or other type of circuit that is capable of processing data in a data processing system, which may have the form of a controller board, computer, server, mobile phone, and/or any other type of electronic device.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 500 may conform to any of the various current implementations and practices known in the art.

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, act, or function is an essential element which must be included in the claim scope: the scope of patented subject matter is defined only by the allowed claims. Moreover, none of these claims are intended to invoke 35 USC § 112(f) unless the exact words "means for" are followed by a participle.

What is claimed is:

1. A system for object connection breaking comprising:
a display device;
an input device;
at least one processor configured to:
cause the display device to display a plurality of connected objects, wherein the plurality of connected objects include two-dimensional (2D) computer-aided design (CAD) objects or three-dimensional (3D) CAD objects that are directly connected to and abut each other to form complex 2D or 3D structures, and wherein each connection includes at least one constraint that acts as a functional association between the connected objects so that object properties are inherited between the connected objects and causes motion of one object to affect the position, shape, or orientation of a connected object;

receive at least one selection input through the input device representative of a selection of a first one of the connected objects while a second one of the connected objects remains unselected, wherein the second object has an initial shape at an initial position, and wherein the first object has an initial position;

responsive to first motion inputs received through the input device representative of the selected first object being moved with a first motion that does not have a predetermined motion characteristic, maintain a connection between the first and second object while changing positions of the first object and the second object, such that the second object no longer has one of either the initial shape or the initial position of the second object, wherein the entire second object moves with movement of the first object prior to the connection between the first and second objects being broken so that the first object and second object together behave as a single complex structure; and responsive to second motion inputs received through the input device representative of the selected first object being moved with a second motion that has the predetermined motion characteristic, break the connection between the first and second objects, cause a current shape and position of the second object to correspond to the initial shape and position of the second object while the current position of the first object does not correspond to the initial position of the first object, and delete the at least one constraint.

2. The system according to claim 1, wherein the at least one processor is configured to maintain the connection between the first and second objects responsive to a determination that the first motion does not have the first characteristic, and wherein the at least one processor is configured to break the connection between the first and second objects responsive to a determination that the second motion inputs are associated with movement of the selected first object and the second object and that the second motion has the predetermined motion characteristic.

3. The system according to claim 1, wherein the predetermined motion characteristic corresponds to a speed, an acceleration, a number of direction changes, an amount of time, a motion distance, or any combination thereof having at least one predetermined relationship with at least one predetermined threshold.

4. The system according to claim 3, wherein the at least one predetermined threshold represents a predetermined speed, and wherein the predetermined motion characteristic corresponds to a motion speed that reaches the predetermined speed.

5. The system according to claim 3, wherein the at least one predetermined threshold represents a predetermined number of direction changes in a predetermined amount of time, and wherein the predetermined motion characteristic corresponds to a motion with a number of direction changes that reaches the predetermined number of direction changes within the predetermined amount of time.

6. The system according to claim 5, wherein the predetermined motion characteristic corresponds to a continuous back and forth shaking motion.

7. The system according to claim 1, wherein a first portion of the second object is directly connected to the first object, wherein a second portion of the second object is indirectly connected to the first object through the first portion of the second object, and wherein responsive to the first and second motion inputs, the at least one processor is configured to change the first portion of the second object to maintain the connection between the first and second objects such that the second object changes in shape during the first and second motions of the first object.

8. The system according to claim 1, wherein the at least one processor is configured to store in a memory object data representative of positions of the first and second objects when the first and second objects were connected, and wherein using the object data the at least one processor is configured to reconnect the first object to the second object responsive to third motion inputs through the input device representative of the selected first object being moved to a further position relative to the second object that is within a predetermined distance of corresponding to the position stored in the memory for when the first and second objects were connected.

9. The system according to claim 1, further comprising a memory, an application software component, and a touch screen comprised of the input device and the display device, wherein the application software component is comprised of instructions that when included in the memory and executed by the at least one processor, cause the at least one processor to manipulate the connected objects outputted through the touch screen responsive to the first and second motion inputs through the touch screen, and wherein the application software component corresponds to a CAD software application that is operative to produce a CAD drawing based at least in part on the motion inputs through the touch screen.

10. A method for object connection breaking comprising: through operation of at least one processor:

causing a display device to display a plurality of connected objects, wherein the plurality of connected objects include two-dimensional (2D) computer-aided design (CAD) objects or three-dimensional (3D) CAD objects that are directly connected to and abut each other to form complex 2D or 3D structures, and wherein each connection includes at least one constraint that acts as a functional association between the connected objects so that object properties are inherited between the connected objects and causes motion of one object to affect the position, shape, or orientation of a connected object;

receiving at least one selection input through an input device representative of selecting a first one of the connected objects while a second one of the connected objects remains unselected, wherein the second object has an initial shape at an initial position, and wherein the first object has an initial position;

responsive to first motion inputs received through the input device representative of the selected first object being moved with a first motion that does not have a predetermined motion characteristic, maintaining a connection between the first and second object while changing positions of the first object and the second object displayed through the display device, such that the second object no longer has one of either the initial shape or the initial position of the second object, wherein the entire second object moves with movement of the first object prior to the connection between the first and second objects being broken so that the first object and second object together behave as a single complex structure; and responsive to second motion inputs received through the input device representative of the selected first object being moved with a second motion that has the predetermined motion characteristic, breaking the connection between the first and second objects, causing a current shape and position of the second object to correspond to the initial shape and position of the second object while the current position of the first object does not correspond to the initial position of the first object, and deleting the at least one constraint.

11. The method according to claim 10, wherein maintaining the connection between the first and second objects is carried out responsive to determining that the first motion does not have the first characteristic, and wherein breaking the connection between the first and second objects is carried out responsive to determining that the second motion inputs are associated with movement of the selected first object and the second object and that the second motion has the predetermined motion characteristic.

12. The method according to claim 10, wherein the predetermined motion characteristic corresponds to a speed, an acceleration, a number of direction changes, an amount of time, a motion distance, or any combination thereof having at least one predetermined relationship with at least one predetermined threshold.

13. The method according to claim 12, wherein the at least one predetermined threshold represents a predetermined speed, and wherein the predetermined motion characteristic corresponds to a motion speed that reaches the predetermined speed.

14. The method according to claim 12, wherein the at least one predetermined threshold represents a predetermined number of direction changes in a predetermined amount of time, and wherein the predetermined motion characteristic corresponds to a motion with a number of direction changes that reaches the predetermined number of direction changes within the predetermined amount of time.

15. The method according to claim 14, wherein the predetermined motion characteristic corresponds to a continuous back and forth shaking motion.

16. The method according to claim 10, wherein a first portion of the second object is directly connected to the first object, wherein a second portion of the second object is indirectly connected to the first object through the first portion of the second object, and further comprising:

responsive to the first and second motion inputs, through operation of the at least one processor, changing the first portion of the second object to maintain the connection between the first and second objects such that the second object changes in shape during the first and second motions of the first object.

17. The method according to claim 10, further comprising:

through operation of the at least one processor, storing object data in a memory representative of positions of the first and second objects when the first and second objects were connected, through operation of the at least one processor, using the object data to reconnect the first object to the second object responsive to third motion inputs through the input device representative of the selected first object being moved to a further position relative to the second object that is within a predetermined distance of corresponding to the position stored in the memory for when the first and second objects were connected.

18. A non-transitory computer readable medium encoded with executable instructions that when executed by at least one processor, cause the at least one processor to carry out a method for object connection breaking comprising:

causing a display device to display a plurality of connected objects, wherein the plurality of connected objects include two-dimensional (2D) computer-aided design (CAD) objects or three-dimensional (3D) CAD objects that are directly connected to and abut each other to form complex 2D or 3D structures, and wherein each connection includes at least one constraint that acts as a functional association between the connected objects so that object properties are inherited between the connected objects and causes motion of one object to affect the position, shape, or orientation of a connected object;

receiving at least one selection input through an input device representative of selecting a first one of the connected objects while a second one of the connected objects remains unselected, and wherein the second object has an initial shape at an initial position, wherein the first object has an initial position;

responsive to first motion inputs received through the input device representative of the selected first object being moved with a first motion that does not have a predetermined motion characteristic, maintaining a connection between the first and second object while changing positions of the first object and the second object displayed through the display device, such that the second object no longer has one of either the initial shape or the initial position of the second object, wherein the entire second object moves with movement of the first object prior to the connection between the first and second objects being broken so that the first object and second object together behave as a single complex structure; and responsive to second motion inputs received through the input device representative of the selected first object being moved with a second motion that has the predetermined motion characteristic, breaking the connection between the first and second objects, causing a current shape and position of the second object to correspond to the initial shape and position of the second object while the current position of the first object does not correspond to the initial position of the first object, and deleting the at least one constraint.

* * * * *